United States Patent
Hsu et al.

(10) Patent No.: US 9,018,698 B2
(45) Date of Patent: Apr. 28, 2015

(54) TRENCH-BASED DEVICE WITH IMPROVED TRENCH PROTECTION

(71) Applicant: Vishay General Semiconductor LLC, Hauppauge, NY (US)

(72) Inventors: Chih Wei Hsu, Taipei (TW); Max Chen, Taipei Hsien (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 0 days.

(21) Appl. No.: 13/678,571

(22) Filed: Nov. 16, 2012

(65) Prior Publication Data

US 2014/0138764 A1    May 22, 2014

(51) Int. Cl.
*H01L 29/66* (2006.01)
*H01L 29/872* (2006.01)
*H01L 29/06* (2006.01)

(52) U.S. Cl.
CPC ........ *H01L 29/8725* (2013.01); *H01L 29/6606* (2013.01); *H01L 29/0623* (2013.01)

(58) Field of Classification Search
USPC ......... 257/320, 328, 329, 270, 271, 341, 475, 257/301, E21.345, E29.133, E21.418, 257/E29.02, E29.066, E29.257, 135–136, 257/242, E27.091, E27.095–E27.096, 257/E29.118, E29.274, E29.313, E29.318, 257/E29.262, 330, 331–335, 257/E31.065–E31.066, E29.338, E27.04, 257/E27.068, E29.041, 408, 549–550, 257/E29.266–E29.269, 137, 156, 173, 192; 438/136, 137, 156, 173, 192
See application file for complete search history.

(56) References Cited

U.S. PATENT DOCUMENTS

| | | | |
|---|---|---|---|
| 8,704,295 B1 * | 4/2014 | Darwish et al. | 257/330 |
| 2007/0132037 A1 | 6/2007 | Hoshi et al. | |
| 2008/0217625 A1 | 9/2008 | Kuroda et al. | |
| 2008/0217725 A1 | 9/2008 | Tu et al. | |
| 2009/0309181 A1 * | 12/2009 | Hsieh | 257/471 |
| 2010/0289109 A1 | 11/2010 | Henning et al. | |
| 2010/0314707 A1 * | 12/2010 | Yedinak et al. | 257/475 |
| 2012/0037982 A1 | 2/2012 | Yedinak et al. | |
| 2012/0098082 A1 | 4/2012 | Hsu et al. | |
| 2012/0181652 A1 | 7/2012 | Qu et al. | |
| 2012/0187478 A1 * | 7/2012 | Takaya | 257/331 |
| 2012/0205772 A1 | 8/2012 | Chen | |
| 2012/0241898 A1 | 9/2012 | Ohta et al. | |

(Continued)

FOREIGN PATENT DOCUMENTS

| | | |
|---|---|---|
| JP | 2009-525776 | 10/2009 |
| JP | 2010-205833 | 9/2010 |

(Continued)

*Primary Examiner* — Dao H Nguyen
*Assistant Examiner* — Tram H Nguyen
(74) *Attorney, Agent, or Firm* — Stuart H. Mayer; Karin L. Williams; Mayer & Williams PC (57) ABSTRACT

A semiconductor device includes a semiconductor substrate having a first type of conductivity. A first layer is formed on the substrate having the first type of conductivity and is more lightly doped than the substrate. At least one trench is formed in the first layer. A dielectric layer lines the bottom surface and the sidewalls of the trench. A conducting material fills the trench. A lightly doped region is formed in the first layer having the second conductivity type. The lightly doped region is disposed below the bottom surface of the trench. A metal layer is disposed over the first layer and the conducting material. A first electrode is formed over the metal layer and a second electrode is formed on a backside of the substrate.

13 Claims, 5 Drawing Sheets

(56) References Cited

U.S. PATENT DOCUMENTS

| | | |
|---|---|---|
| 2012/0280281 A1 | 11/2012 | Bahl |
| 2013/0009165 A1 | 1/2013 | Park et al. |
| 2013/0015460 A1 | 1/2013 | Chen |
| 2013/0200451 A1* | 8/2013 | Yilmaz et al. ................ 257/331 |
| 2013/0248874 A1 | 9/2013 | Kuraguchi |
| 2013/0256679 A1 | 10/2013 | Yao et al. |

FOREIGN PATENT DOCUMENTS

| | | |
|---|---|---|
| KR | 10-2007-0092473 | 9/2007 |
| KR | 10-2010-0122281 | 11/2010 |

* cited by examiner

TRENCH-BASED DEVICE WITH IMPROVED TRENCH PROTECTION

FIELD OF THE INVENTION

The present invention relates generally to trench-based semiconductor device, and more particularly to a trench-based semiconductor device in which stress caused by high electric fields in the vicinity of the trench is reduced.

BACKGROUND

Conventionally, a Schottky diode includes a heavily-doped semiconductor substrate, typically made of single-crystal silicon. A second layer covers the substrate. The second layer, called the drift region, is less heavily-doped with impurities having carriers of the same conducting type as the substrate. A metal layer or a metal silicide layer forms a Schottky contact with the lightly-doped drift region and forms the diode anode.

Two opposing constraints arise when forming a unipolar component such as a Schottky diode. In particular, the components should exhibit the lowest possible on-state resistance (Ron) while having a high breakdown voltage. Minimizing the on-state resistance imposes minimizing the thickness of the less doped layer and maximizing the doping of this layer. Conversely, to obtain a high reverse breakdown voltage, the doping of the less doped layer must be minimized and its thickness must be maximized, while avoiding the creation of areas in which the equipotential surfaces are strongly bent.

Various solutions have been provided to reconcile these opposite constraints, which has led to the development of trench MOS-capacitance Schottky diode structures, which are referred to as Trench MOS Barrier Schottky (TMBS) diodes. In an example of such devices, trench regions are formed in the upper portion of a thick drift layer that is less heavily doped with impurities of the same conductivity type than the underlying substrate. The trench regions are filled with a MOS structure. An anode metal layer is evaporated to cover the entire surface and forms a Schottky contact with the underlying drift region.

When reverse biased, the insulated conductive areas cause a lateral depletion of charge into the drift region, which modifies the distribution of the equipotential surfaces in this layer. This enables increasing the drift region doping, and thus reducing the on-state resistance with no adverse effect on the reverse breakdown voltage. However, even in these devices the electric field distribution in the drift region is still far from ideal.

SUMMARY OF THE INVENTION

In accordance with one aspect of the invention, a semiconductor device includes a semiconductor substrate having a first type of conductivity. A first layer is formed on the substrate having the first type of conductivity and is more lightly doped than the substrate. At least one trench is formed in the first layer. A dielectric layer lines the bottom surface and the sidewalls of the trench. A conducting material fills the trench. A lightly doped region is formed in the first layer having the second conductivity type. The lightly doped region is disposed below the bottom surface of the trench. A metal layer is disposed over the first layer and the conducting material. A first electrode is formed over the metal layer and a second electrode is formed on a backside of the substrate.

In accordance with another aspect of the invention, a method is provided for fabricating a semiconductor device. The method includes providing a semiconductor substrate having a first type of conductivity. A first layer, which is formed on the substrate, has the first type of conductivity and is more lightly doped than the substrate. At least one trench is formed in the first layer. A bottom surface and sidewalls of the trench are lined with a dielectric layer. The dielectric layer is etched back from the bottom surface of the trench. A dopant of the second conductivity type is implanted into the first layer through the bottom surface of the trench. The trench is filled with a conducting material. A metal layer is formed over the first layer and the conducting material. A first electrode is formed over the metal layer and a second electrode is formed on a backside of the substrate.

DETAILED DESCRIPTION

Trench-based semiconductor devices such as trench MOS devices (e.g., Trench MOS Barrier Schottky rectifiers, Tandom PiN Schottky rectifiers) may experience large electric fields in the vicinity of the trench bottom. As detailed below, these electric fields may be reduced by incorporating a lightly doped region under the trench with a dopant opposite in polarity to the polarity of the drift region. That is, if an n-drift region is employed, the lightly doped region under the trench will be doped with a p-type dopant. By reducing the electric fields in this manner the breakdown voltage of the device can be increased. Moreover, by alleviating the stresses that can result from the large electric fields, which can cause problems such as oxide degradation, the robustness of the device, and hence its long term reliability, also can be enhanced.

For purposes of illustration only and not as a limitation on the subject matter disclosed herein, the manner in which electric fields are reduced in the vicinity of the trench bottom will be presented in the context of a TMBS diode. More generally, as noted above, these techniques may be used to reduce the electric fields in a wide variety of different trench-based semiconductor devices.

Figure 1:
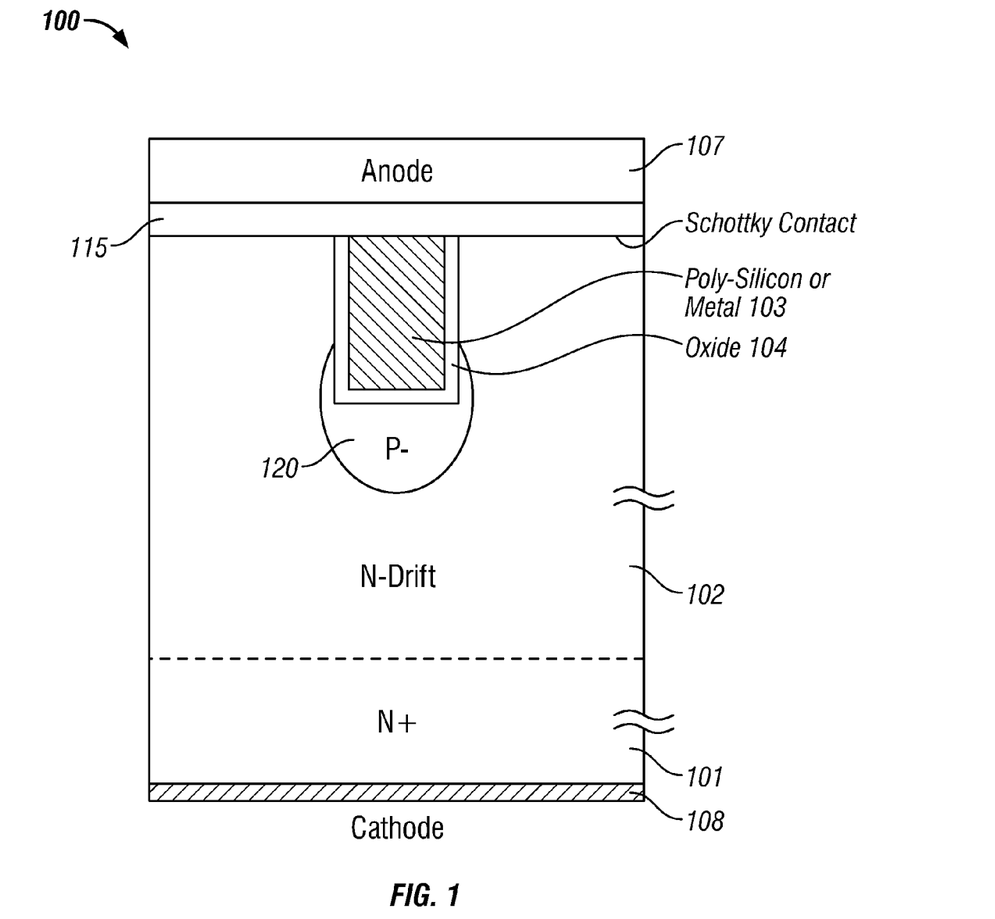
FIG. 1 shows one example of a Trench MOS Barrier Schottky (TMBS) diode.

FIG. 1 shows one example of a Trench MOS Barrier Schottky (TMBS) rectifier or diode 100. As shown, the diode 100 includes a highly doped substrate 101 that is heavily doped with a dopant of a first conductivity type (e.g., n+ type). An epitaxial drift layer 102 is formed on the substrate 101 and is more lightly doped with a dopant of the first conductivity type (e.g., n-type). One or more openings are formed in the epitaxial drift layer 102, which may be, for example, trench-shaped. For simplicity only a single opening is shown in FIG. 1. An electric field-reducing region 120 doped with a dopant of a second conductivity type (e.g., p-type) surrounds the bottom of the opening. In particular, the electric field-reducing region 120 extends from the bottom of the opening, encompassing its bottom corners and contacting a portion of the sidewalls adjacent to the bottom of the opening.

Conductive regions 103 are formed in the openings, which are made, for example, of a metal or doped polysilicon. An insulating layer 104 is interposed between each conductive region 103 and the walls of the corresponding opening (e.g., trench). The insulating layer 104 may be formed, for example, by thermal oxidation and the opening may be filled with polysilicon by conformal deposition, followed by a planarization step. After filling the opening, a metal, for example, nickel, capable of forming a silicide layer 115 above the epitaxial layer 102 and above the polysilicon filled areas in the opening, is deposited. Once the silicide has been formed, the metal which has not reacted with the semiconductor material is removed by selective etch. After this, an anode metal 107 is formed on the upper surface side over the silicide layer 115 and a cathode metal 108 is formed on the lower surface side of the substrate 101.

The provision of the electric field-reducing region 120 which surrounds the bottom of the trench, including the trench corners, reduces the electric field in the vicinity of the trench bottom, and particularly in the vicinity of the trench corners. This reduction is accomplished because the electric field-reducing region 120 decreases the electric field crowding that would otherwise occur in this region.

Figure 2:
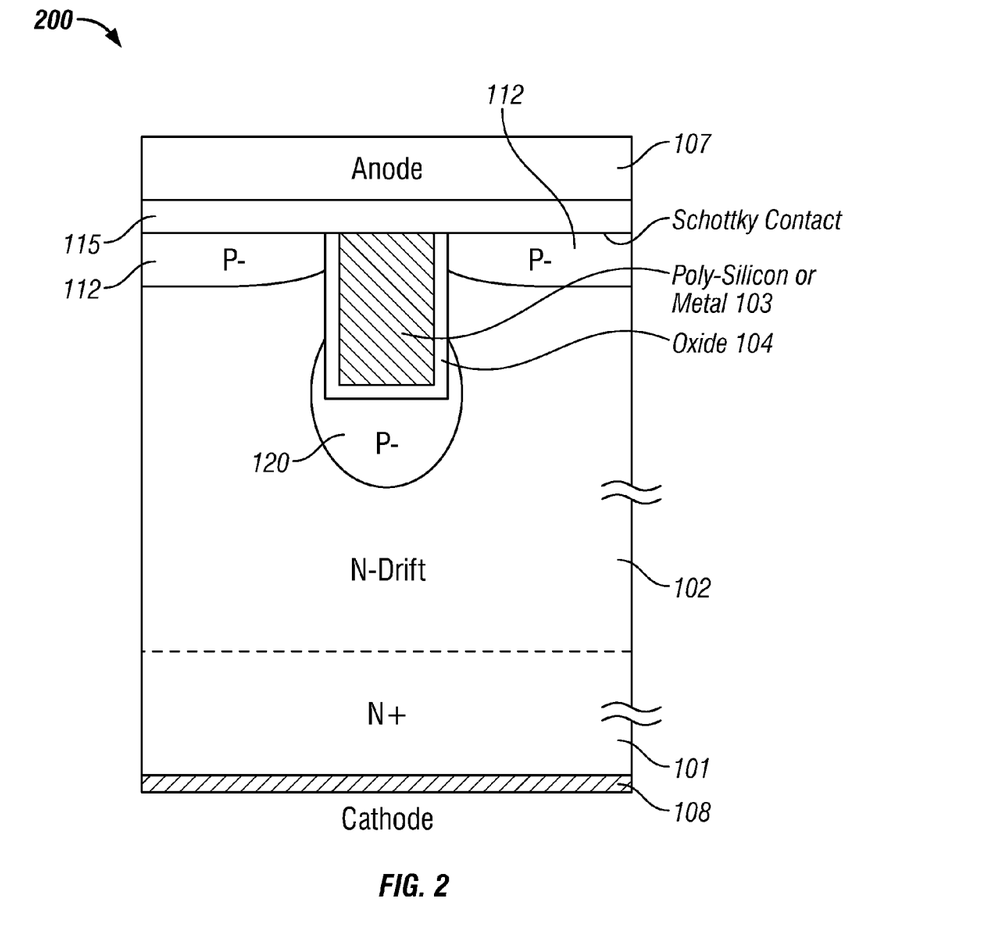
FIG. 2 shows one alternative embodiment of the TMBS diode shown in FIG. 1.

FIG. 2 shows one alternative embodiment of a TMBS diode 200 similar to the embodiment shown in FIG. 1 except that a so-called transparent layer 112 doped with a dopant of a second conductivity type (e.g., p-type) is formed in the drift region 102 adjacent to the opening. In FIGS. 1 and 2 like elements are denoted by like reference numerals. The transparent layer 112 is located below and in contact with the silicide layer 115. The transparent layer 112 forms a Schottky contact with the metallization at its surface and it also forms a low injection efficiency junction at the interface with the drift region 102. Unlike the device shown in FIG. 1, this device has a mixed bipolar and unipolar conduction controlled by the p-transparent layer/n-drift layer injection and the Schottky barrier, respectively.

The TMBS diode 200 shown in FIG. 2 advantageously offers a relatively rapid switching speed close to that of a Schottky rectifier while preserving higher current capability and considerably lower on-state losses than a Schottky rectifier. These advantages arise because the transparent layer 112 injects minority carriers (holes) in the drift region and allows the formation of a plasma (excess of electrons and holes in quasi-neutrality equilibrium, in concentrations above the doping level). However, the injection of the plasma is limited by the Schottky contact and further controlled by the 'transparency' of the transparent layer 112. By making the transparent layer 112 more lightly doped (below the level of dopant needed to form an ohmic contact with the metal layer above it), the transparency increases, allowing a higher fraction of electron current to penetrate through it and reach the anode contact. This results in less plasma formation in the on-state and, as a result, a faster reverse recovery response. By increasing the doping in the transparent layer, but while still preserving the Schottky contact (in other words suppressing significant tunnelling specific to Ohmic contacts), the plasma level can be increased with a further increase in the on-state performance, though at the expense of increased switching losses. Additional details concerning the use of a transparent layer as described above may be found in U.S. Appl. Ser. No. 61/405,293.

One example of a method that may be employed to form the TMBS diode of FIG. 1 will be described with reference to FIGS. 3-8.

Figure 3:
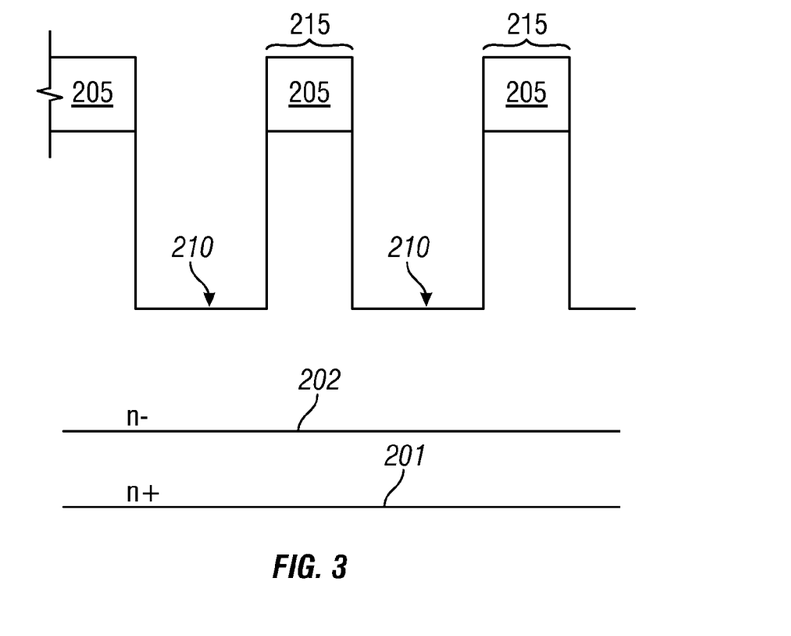
FIGS. 3-8 show one example of a sequence of process steps that may be employed to form the TMBS Schottky diode of FIG. 1.

FIG. 3 is a cross-sectional view of a semiconductor structure that includes a first epitaxial layer 202 having a dopant of a first conductivity type (e.g., n-type) formed on a base substrate 201 which is more heavily doped with a dopant of the first conductivity type (e.g., n+ type). An oxide layer 205 is formed on the first substrate 100A by chemical vapor deposition (CVD), for example, to a thickness of about 2000-10,000 angstroms. Next, a photoresist (not shown) is coated on the oxide layer 205 to define a plurality of trenches 210. The trenches 210 are spaced apart from one another by mesas 215. In one example each of the trenches 210 is about 0.2-2.0 microns in width. It should be noted that the trench bottom can have a variety of configurations including, for example, v-shaped, rounded u-shaped and square configurations. Moreover, the trench sidewalls may be substantially vertical or tapered.

Figure 4:
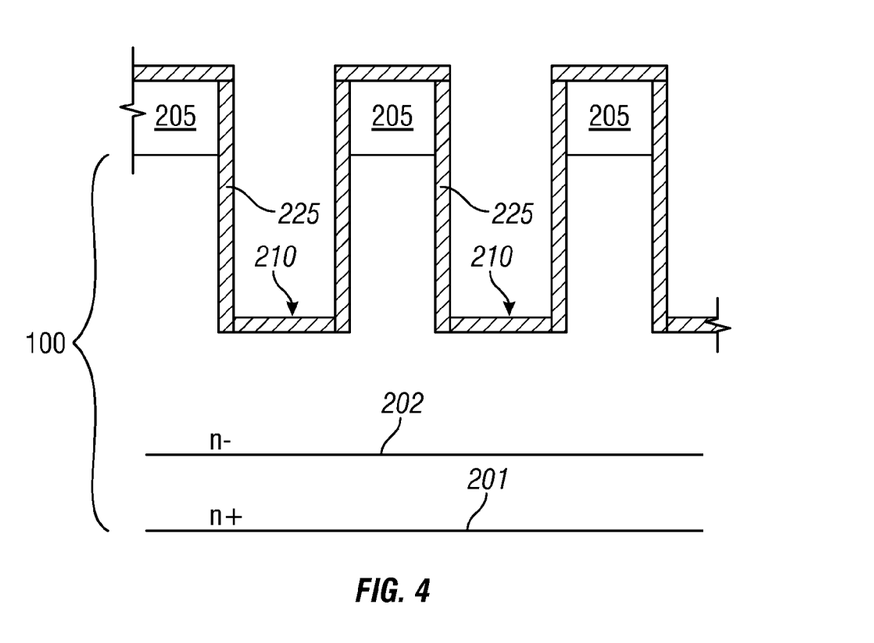

Referring to FIG. 4, a high temperature oxidation process is performed to form gate oxide layer 225. The gate oxide layer 225 in some examples has a thickness between about 150 angstroms and 3000 angstroms. Instead of an oxidation process, the gate oxide layer 225 may be formed by high temperature deposition to form a HTO (high temperature oxide deposition) layer.

Figure 5:
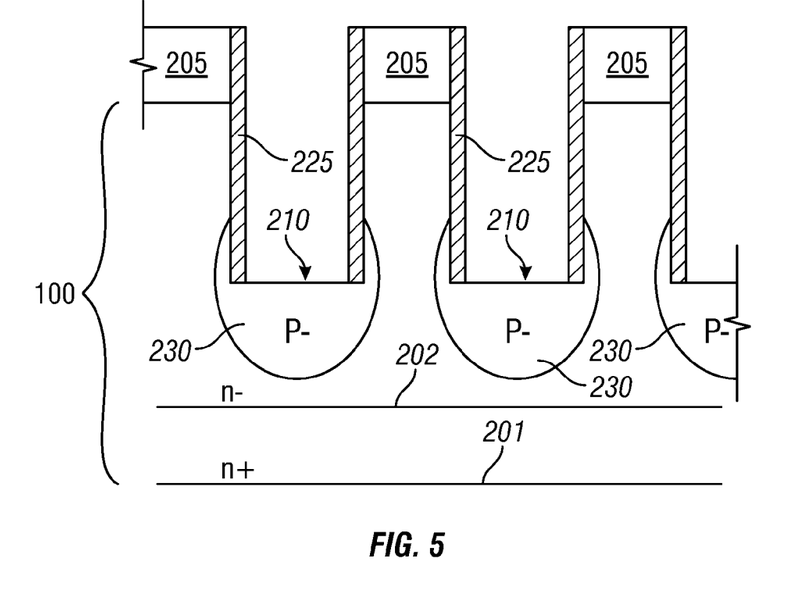

As shown in FIG. 5, the gate oxide layer 225 is etched back using, for example, a dry etching technique or the like, to remove the portions of the gate oxide 225 lining the bottom of the trenches 210 and the portion overlying oxide layer 205. An electric field-reducing region 230 may then be formed by ion implantation through the bottom of the trenches 210 using the gate oxide 225 as a mask. By controlling the thickness of the gate oxide 225 along the sidewalls of the trenches some ions also may be implanted through the portions of the sidewalls adjacent to the bottom of the trenches 210. A subsequent diffusion step is performed to expand the electric field-reducing regions 230. In this way the electric field-reducing regions 230 that are formed surround the bottom of the trenches 210.

Figure 6:
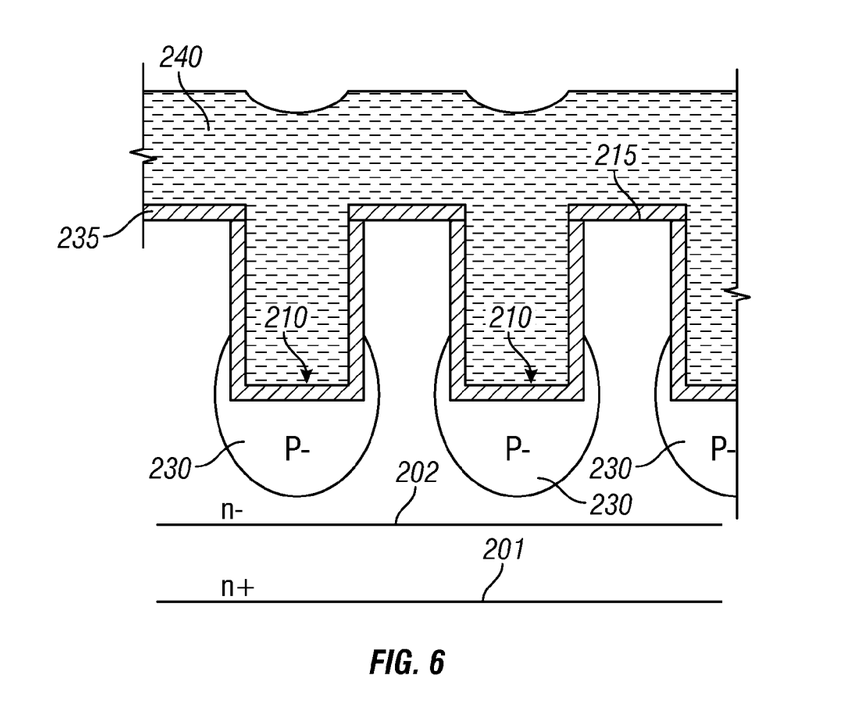

Next, referring to FIG. 6, the layer 225 and layer 205 are removed, and a second high temperature oxidation process is performed to form a gate oxide layer 235 on the bottom of the trenches 210. A first conductive layer 240 is then formed by CVD on the gate oxide 235 and fills the trenches 210. The first conductive layer 240 has a thickness such that it extends over mesas 215. The first conductive layer 240, which may be any suitable material such as a metal, doped-polysilicon or doped-amorphous silicon, may have a thickness of about 0.5 to 3.0 microns. In order to prevent voids from forming in the inner portion of the trenches 210, the first conductive layer 240 may be polysilicon formed by an LPCVD (low pressure CVD) process, which has good step coverage. However, in some cases amorphous silicon may be better able to eliminate voids than polysilicon. To make the amorphous silicon conductive a recrystallization process may be employed.

Figure 7:
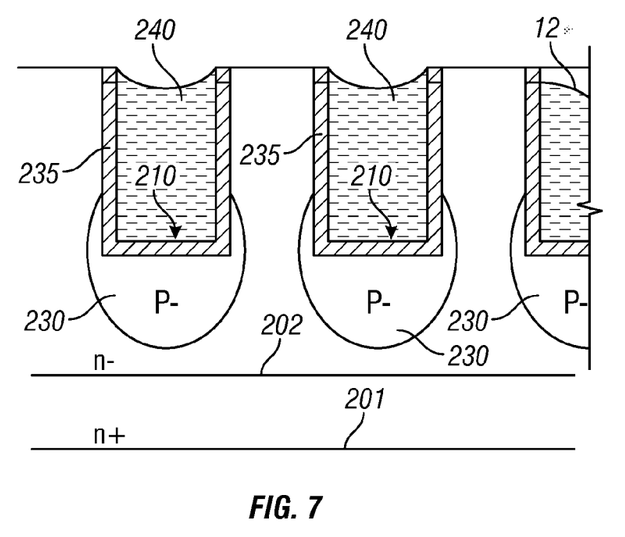
Figure 8:
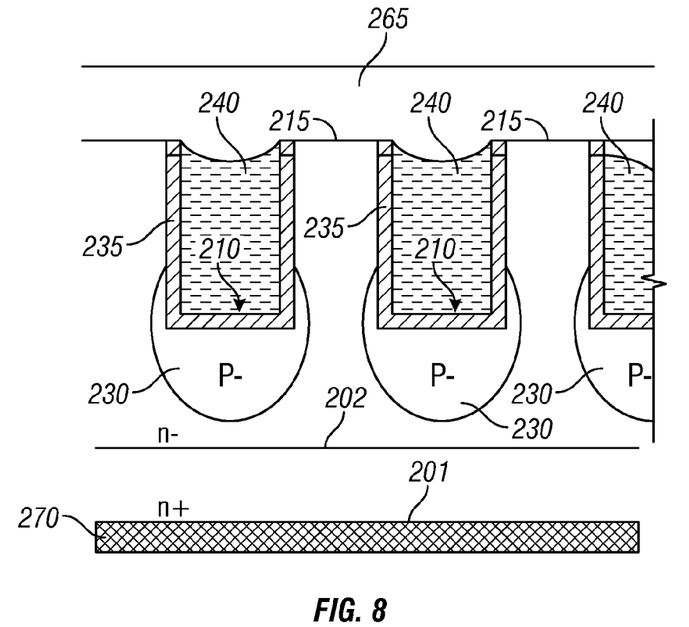

Referring now to FIG. 7 an anisotropic etching is performed to remove the excess first conductive layer 240 and the portion of the gate oxide layer 235 located on the surface of the first layer 202. Next, in FIG. 8 a sputtering or other suitable process is performed to deposit a second conductive layer 265 over the entire structure so as to form Schottky junction regions on mesas 215. The conductive layer 265 may be formed from any material that can form a Schottky diode with the underlying first layer 202. For example, the conductive layer 265 may be a metal silicide layer. Finally, a cathode electrode 270 is deposited on the backside of substrate 100B.

If the device 200 shown in FIG. 2 is to be formed, the fabrication process proceeds as described above. However, after the trenches 210 are filled by the conductive layer 240 and etched back as described above, the transparent regions 112 (p-type in this example) can be formed by using, for example, an implantation or diffusion technique. For instance, in one implementation the transparent regions are formed by implantation, followed by rapid annealing and possibly a light drive-in to control the dosage and junction depth of the transparent regions. As previously mentioned, the doping concentration (or the charge dosage) of the transparent regions can be suitably adjusted to determine the appropriate trade-off between the on-state voltage and switching losses.

Of course, as noted above, trench-base semiconductor devices other than a Schottky rectifier may be provided in which the Schottky junction is replaced with other types of junctions, the nature of which will depend on the particular device being formed. As those of ordinary skill in the art will recognize, this can be accomplished by providing in the device shown in FIG. 7 one or more suitable junction layers instead of the second conductive layer 165.

EXAMPLE

The electric field-reducing region 120 shown in the embodiment of FIG. 2 is arranged below the bottom surface of the trench and contacts a portion of the sidewalls adjacent the bottom of the trench. The transparent layer can be formed by ion implantation and/or diffusion techniques using a suitable p-type dopant. To minimize the implantation-induced crystal damage, the implantation energy may be kept low (e.g., 25 KeV). The implantation step may be followed by an annealing step (e.g., for 60 minutes at a temperature of 950° C.). Depending on the chosen design and ratings (blocking voltage capability, leakage current and turn-off speed), illustrative geometrical dimensions and conductivities of the main layers in the structure are given below:

p-concentration: $1 \times 10^{13}$ cm$^{-3}$ to $5 \times 10^{18}$ cm$^{-3}$
p-depth: 0.05 µm to 10 µm
trench depth: 0.5 µm to 10.0 µm
trench width: 0.5 µm to 5.0 µm
mesa width (i.e. the spacing between the adjacent trenches): 0.3 µm to 30.0 µm
N-drift region length: 5 µm to 200 µm
N-drift region concentration: $5 \times 10^{12}$ cm$^{-3}$ to $5 \times 10^{17}$ cm$^{-3}$ The above examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

The invention claimed is:

1. A semiconductor device, comprising:
a semiconductor substrate having a first type of conductivity;
a first layer formed on the substrate having the first type of conductivity and being more lightly doped than the substrate;
at least one trench formed in the first layer;
a dielectric layer lining a bottom surface and sidewalls of the at least one trench;
a conducting material filling the at least one trench;
a lightly doped region formed in the first layer having a second conductivity type, said lightly doped region being disposed below the bottom surface of the trench;
a metal layer disposed over and contacting the first layer and the conducting material;
a second layer formed on the substrate and having the second conductivity type, the second layer being located adjacent to at least one side of the trench and being lightly doped so that a Schottky contact is formed between the metal layer disposed over the first layer and the conducting material and the second layer; and
a first electrode formed over the metal layer and a second electrode formed on a backside of the substrate.

2. The semiconductor device of claim 1 wherein the lightly doped region extends from the bottom of the trench.

3. The semiconductor device of claim 2 wherein the lightly doped region surrounds the bottom of the trench and contacts a portion of the sidewalls adjacent the bottom of the trench.

4. The semiconductor device of claim 1 wherein the first layer and the metal layer form a Schottky contact therebetween.

5. The semiconductor device of claim 1 wherein the second layer is formed in the first layer.

6. The semiconductor device of claim 5 wherein the second layer is adjacent to both sides of the trench.

7. The semiconductor device of claim 1 wherein the second layer has a doping concentration less than that needed to form an Ohmic contact between the metal layer and the second layer.

8. A method of fabricating a semiconductor device, comprising:
providing a semiconductor substrate having a first type of conductivity;
forming a first layer on the substrate, said first layer having the first type of conductivity and being more lightly doped than the substrate;
forming at least one trench in the first layer; lining a bottom surface and sidewalls of the at least one trench with a dielectric layer;
etching back the dielectric layer from the bottom surface of the trench;
implanting a dopant of a second conductivity type into the first layer through the bottom surface of the trench;
filling the at least one trench with a conducting material; forming a metal layer over the first layer and the conducting material; and
forming a first electrode over the metal layer and a second electrode on a backside of the substrate;
forming a second layer on the substrate and having the second conductivity type, the second layer being located adjacent to at least one side of the trench and being lightly doped so that a Schottky contact is formed between the metal layer and the second layer.

9. The method of claim 8 further comprising using at least the dielectric layer as a mask to implant the dopant of the second conductivity type into the first layer.

10. The method of claim 8 wherein the first layer and the metal layer form a Schottky contact therebetween.

11. A semiconductor device, comprising:
a semiconductor substrate having a first type of conductivity;
a first layer formed on the substrate having the first type of conductivity and being more lightly doped than the substrate;
at least one trench formed in the first layer;
a dielectric layer lining a bottom surface and sidewalls of the at least one trench;
a conducting material filling the at least one trench;
a lightly doped region formed in the first layer having a second conductivity type, said lightly doped region being disposed below the bottom surface of the trench; and
a junction layer disposed over and contacting both the first layer and the conducting material filling the at least one trench, and defining a Schottky junction between the junction layer and the first layer.

12. The semiconductor device of claim 11 wherein the lightly doped region extends from the bottom of the trench.

13. The semiconductor device of claim 11 wherein the lightly doped region surrounds the bottom of the trench and contacts a portion of the sidewalls adjacent the bottom of the trench.

* * * * *